US008758649B2

(12) United States Patent
James et al.

(10) Patent No.: US 8,758,649 B2
(45) Date of Patent: Jun. 24, 2014

(54) ORGANIC SEMICONDUCTOR FORMULATION

(75) Inventors: Mark James, Romsey (GB); Philip Edward May, Sidcup (GB)

(73) Assignee: Merck Patent GmbH, Darmstadt (DE)

( * ) Notice: Subject to any disclaimer, the term of this patent is extended or adjusted under 35 U.S.C. 154(b) by 622 days.

(21) Appl. No.: 12/920,910

(22) PCT Filed: Feb. 6, 2009

(86) PCT No.: PCT/EP2009/000821
§ 371 (c)(1),
(2), (4) Date: Sep. 3, 2010

(87) PCT Pub. No.: WO2009/109273
PCT Pub. Date: Sep. 11, 2009

(65) Prior Publication Data
US 2011/0006265 A1    Jan. 13, 2011

(30) Foreign Application Priority Data

Mar. 6, 2008   (EP) .................................... 08004121

(51) Int. Cl.
*H01B 1/12*       (2006.01)
*B41M 1/04*       (2006.01)
*G03F 5/20*       (2006.01)

(52) U.S. Cl.
USPC ............... 252/500; 427/58; 427/66; 427/99.2

(58) Field of Classification Search
USPC ............................. 252/500; 427/58, 66, 99.2
See application file for complete search history.

(56) References Cited

U.S. PATENT DOCUMENTS

| 6,541,300 | B1 | 4/2003 | Chowdhuri et al. |
| 7,115,216 | B2 | 10/2006 | Carter et al. |
| 2002/0001026 | A1 | 1/2002 | Ishikawa et al. |
| 2003/0010283 | A1 | 1/2003 | Yamazaki et al. |
| 2004/0232385 | A1 | 11/2004 | Kram et al. |
| 2006/0022174 | A1 | 2/2006 | Rogojevic et al. |
| 2006/0033080 | A1 | 2/2006 | Harada et al. |
| 2007/0102696 | A1* | 5/2007 | Brown et al. .................... 257/40 |
| 2007/0137520 | A1 | 6/2007 | Brown et al. |
| 2007/0212807 | A1 | 9/2007 | Yamada et al. |
| 2010/0213455 | A1* | 8/2010 | James et al. .................... 257/40 |
| 2012/0256137 | A1* | 10/2012 | James et al. ................... 252/500 |
| 2013/0069020 | A1* | 3/2013 | May et al. ................. 252/519.21 |
| 2013/0161594 | A1* | 6/2013 | James et al. .................... 257/40 |

FOREIGN PATENT DOCUMENTS

| EP | 1 122 793 | A2 | 8/2001 |
| EP | 1 416 069 | A1 | 5/2004 |
| EP | 1 808 866 | A1 | 7/2007 |
| JP | 2005-328030 | A | 11/2005 |
| JP | 2006054063 | A | 2/2006 |
| WO | WO 03/053707 | A2 | 7/2003 |
| WO | WO 03/069959 | A1 | 8/2003 |
| WO | WO 2005/041322 | A1 | 5/2005 |
| WO | WO 2006010555 | A1 * | 2/2006 |
| WO | WO 2009049744 | A1 * | 4/2009 |

OTHER PUBLICATIONS

Park, Sung Kyu, et al., "F-TES ADT Organic Integrated Circuits on Glass and Plastic Substrates", Electron Devices Meeting, 2007, IEEE International, 225-228, Dec. 10-12, 2007.*
Gundlach, D.J., et al., "Contact-induced crystallinity for high-performance soluble acene-based transistors and circuits", Nature Materials, 7, Mar. 2008, 216-221.*
Jurchescu, O.D., et al., "Organic Single-Crystal Field-Effect Transistors of a Soluble Anthradithiophene", Chem. Mater, 2008, 20, 6733-6737.*
Park, Sung Kyu, et al., "Polymeric Substrate Spin-Cast diF-TESADT OTFT Circuits", IEEE Electron Device Letters, 29, 9, Sep. 2008, 1004-1006.*
Smith, Jeremy, et al., "High-performance organic integrated circuits based on solution processable polymer-small molecule blends", App. Phys. Lett. 93, 253301 (2008), 1-3.*
Subramanian, Sankar, et al., "Chromophore Fluorination Enhances Crystallization and Stability of Soluble Anthradithiophene Semiconductors", J.Am.Chem.Soc. 2008, 130, 2706-2707.*
Platt, A.D., "Novel Functionalized Anthradithiophene and Pentacene Derivatives: Photoconductive and Fluorescent Properties", Polymer Preprints, 2008, 49(2), 984-985.*
Teague, Lucile C., et al., "Surface Potential Imaging of Solution Processable Acene-Based Thin Film Transistors", Adv. Mater. 2008, 20, 4513-4516.*
Handbook of Chemistry and Physics, 56th edition, Robert C. Weast, editor, 1975, pp. F-50, 51, and 55.*
International Search Report of PCT/EP2009/000821 (Mar. 19, 2009).
List (Existing IP and Papers for High Viscosity Solvents IP Proposal).
Product Data Sheet: "Additives for Screen Printing HM".
C. Hansch et al., "A Quantitative Approach to Biochemical Structure-Activity Relationships," Biochemical Structure-Activity Relationships, vol. 2 (Aug. 1969) pp. 232-239.
XP-002520175 "(-)-Alpha-Terpineol".
Asahi Glass Co Ltd., "Mixed solution for display device and display device using the same," Patent Abstracts of Japan, Publication Date: Feb. 23, 2006; English Abstract of JP-2006-054063.

* cited by examiner

*Primary Examiner* — Douglas McGinty
(74) *Attorney, Agent, or Firm* — Millen, White, Zelano & Branigan, P.C.

(57) ABSTRACT

The invention relates to a process for preparing a formulation comprising an organic semiconductor (OSC) and one or more organic solvents, to novel formulations obtained by this process, to their use as coating or printing inks for the preparation of organic electronic (OE) devices, especially organic field effect transistors (OFET) and organic photovoltaic (OPV) cells, to a process for preparing OE devices using the novel formulations, and to OE devices prepared from such a process or from the novel formulations.

18 Claims, 2 Drawing Sheets

ORGANIC SEMICONDUCTOR FORMULATION

FIELD OF THE INVENTION

The invention relates to a process for preparing a formulation comprising an organic semiconductor (OSC) and one or more organic solvents, to novel formulations obtained by this process, to their use as coating or printing inks for the preparation of organic electronic (OE) devices, especially organic field effect transistors (OFET) and organic photovoltaic (OPV) cells, to a process for preparing OE devices using the novel formulations, and to OE devices prepared from such a process or from the novel formulations.

BACKGROUND AND PRIOR ART

When preparing OE devices, like OFETs or OPV cells, or organic light-emitting devices, like organic light-emitting diodes (OLED), in particular flexible devices, usually coating or printing techniques are used to apply the layer of the OSC material. Printing formulations that have hitherto been used in prior art for the preparation of OE devices are usually solution based, comprise aromatic or aliphatic organic solvents and tend to have low viscosities. While this approach serves well for spin coating and ink jet printing (IJP) fabrication methods, recently there has been a growing interest in using traditional printing technologies, like flexographic or gravure printing, to fabricate devices. This requires different types of formulations, in particular with respect to the choice of the solvents and optional additives like viscosity enhancers.

Many printing processes use formulations having a medium viscosity (typically from 10 to 1000 cP), including inks for flexographic and gravure printing, but also for hot jetting IJP, electrostatic IJP, soft lithography and variants thereof, or micro-stamping. However, for printing an OSC material efficiently there are several limitations.

Thus, there is a need to get correct fluid properties for printing by a combination of a single solvent or mixed volatile solvents and the functional material alone, or with the minimum addition of additional viscosity modifiers or binders. This typically results in formulations with a viscosity of <10 cP, like for example from tetralin or xylene solutions etc. Flexographic and gravure printing typically require viscosities of >10 cP to get good print quality, and often formulations having a viscosity in the range of 25-100 cP or even up to 5000 cP are used.

Usually preference is given for a solution of the active material. For example, high viscosity polyols which have viscosities in the above-mentioned ranges do not dissolve or are not compatible with the typical OSC materials of interest, because of the hydrophilic nature of these materials. Additionally, they are often incompatible with the substrates and other parts of the fabrication process.

However, the usual viscosity modifiers (for example inorganics like silica, clays etc., or very high Mw polymers, polyalcohols etc.), which raise the viscosity of the useful solvent up to >10 cP, do on the other hand tend to destroy the OE device performance. Additionally, silicas and clays can adversely affect the low shear flow, rendering the inks unsuitable for IJ, gravure and flexographic printing.

A low viscosity (<10 cP) is often required e.g for spin coating and standard IJP techniques, whereas a high viscosity (>1000 cP) is usually required for example for screen printing, offset lithographic printing etc.

U.S. Pat. No. 6,541,300 discloses a process for preparing an OSC film for use in an OE device, by blending an OSC material with a multicomponent solvent blend and applying the resulting mixture to a substrate. It is claimed that the OSC film obtained by using a solvent blend has a higher mobility and the resulting OE device has a higher on/off ratio, compared to an OSC film, or an OE device including the OSC film, which are produced using only one solvent of the multicomponent solvent blend. However, the claimed process is characterized only by its desired result, i.e. a higher mobility and a higher on/off ratio, but not by the means how this result can be achieved. In particular, the document does not provide a clear guidance for the person skilled in the art how to select suitable solvents in order to achieve a workable formulation. The document only mentions that the solvents of the solvent blend should have a combined polarity ($\phi_m$) from 0.1 to 1.0, wherein the combined polarity is given by the following equation $$\phi_m = \sum_{i=1}^{n} \phi_i \chi_i$$

with n being the number of solvents, $\phi_i$ being the polarity and $\chi_i$ the mole fraction of a single solvent in the solvent blend. Apart from this parameter, however, the document does not provide any limitation or guidance regarding the choice of the OSC compound, and the choice of solvents that are best suitable for a chosen OSC compound. Although the document discloses a list of OSC compounds (including polymers and small molecules) and a list of solvents having a polarity ranging from low to high values, it is not clear if all these solvents will readily dissolve the disclosed OSC compounds. However, it is known that when a solvent does not dissolve an OSC material, the resulting mixture is often not suitable for the preparation of OSC films and OE devices, since the morphology of the resulting OSC film will deteriorate, which will negatively affect the OE device performance. Therefore, in view of the teaching of U.S. Pat. No. 6,541,300, considerable effort is still required to find the appropriate solvents for a given OSC material as disclosed in this document.

WO 03/069959 A1 discloses an OSC film for use in an electroluminescent (EL) device, formed by a wet film process with a composite solution. The composite solution is prepared by dissolving at least two organic compounds in a mixed organic solvent, including at least two organic solvents having different volatility and different solubility for the organic compounds. Again, the document discloses a large list of possible solvents and organic compounds, but does not provide a clear guidance how suitable solvents can be chosen for a given organic compound. Instead, it is merely said that the selection of the at least two organic solvents having different volatility may depend on the property of the organic compounds.

EP 1 416 069 A1 discloses an OSC element comprising a polyacene as OSC material. The document further mentions that the polyacene may be dissolved in a solvent, and that a combination of two or more solvents may be used. However, apart from a list of standard solvents no preference is given to any particular solvent or solvent combination, and no specific guidance is provided regarding the selection of suitable solvents.

WO 2005/041322 A1 discloses an organic polymer solution for use in OE devices comprising at least one organic polymer, a first solvent and a second solvent, wherein the first solvent has a low solubility and faster evaporation rate than the second solvent, and the second solvent has a very low solubility. Also claimed is a method of manufacturing an OE device by depositing the solution on an electrode and allowing it to dry. It is claimed that, due to the different solubility and evaporation rate of the solvents, a substantially uniform polymer layer is formed. However, no specific values or parameter ranges of the solvent properties are given, which could serve as a basis for the selection of suitable solvents.

EP 1 122 793 A2 discloses an organic luminescence device manufactured from an ink comprising an organic EL material and a hydrophobic organic solvent or solvent mixture, wherein the solvents have a dissolving power of at most 5 wt. % of water at room temperature. However, this value does apply to practically all OLED solvents known in prior art and does therefore not consitute a real limitation. It is further mentioned that the ink should have a viscosity of not more than 5000 cP, preferably not more than 100 cP. However, there is no guidance how to select specific solvents to achieve these values. This makes the selection of suitable solvents still difficult, especially when trying to prepare dilute small molecule solutions having high viscosities, without using non-volatile thickening agents.

WO 03/053707 A2 discloses a screen printable EL polymer ink comprising a soluble EL material, an organic solvent having a boiling point between 120 and 200° C., and a viscosity enhancer to maintain a viscosity of above 50 cP. The organic solvent should preferably have a solubility parameter of between 8.8 and 10.0 $(cal/cm^3)^{1/2}$. The majority of viscosity modifiers mentioned in this document are polymers or inorganic particles, as for example disclosed on page 9 or 10. Further reported is the use of "gel retarders" in concentrations from 1 to 20%, which can also be commercially available products, to decrease solvent evaporation and improve ink stability and processability. However, the use of processing additives as suggested in this document is not always desirable in OSC printing inks for the preparation of OE devices, since these processing additives will remain in the OSC layer after removal of the solvent, where they could negatively affect or even destroy the performance of the device. Instead it is more preferable to have only the pure active OSC material left in the OSC layer after drying, without any processing additives. Therefore, apart of the active OSC material the ink should preferably contain only volatile components.

Therefore there is still a need for a process to provide improved formulations and inks of an OSC material suitable for the manufacture of OE devices, especially OFETs and OPV cells, wherein said process allows broad, but precise selection of solvents that have suitable viscosity and do not adversely affect the performance and lifetime of the device. One aim of the present invention is to provide such a process. Another aim is to provide improved OSC formulations obtainable from such a process. Another aim is to provide improved OE devices obtainable from such OSC formulations. Further aims are immediately evident to the person skilled in the art from the following description.

The inventors of the present invention have found these aims can be achieved, and the above-mentioned problems can be solved, by a process of providing OSC formulations as claimed in the present invention. In particular, the inventors of the present invention have found a method to prepare an OSC formulation by selecting a suitable solvent or solvent blend according to its partition ratio (log P) and other parameters like the viscosity and the boiling point. It was found that by appropriate choice of the solvents within specific ranges of these parameters, it is possible to provide improved OSC formulations, wherein the solvents dissolve the OE compounds at useful levels and still have viscosities that are suitable for the desired printing or coating technique. Since the parameters are defined for the pure solvents, i.e. without any non-volatile additives, it is easier for the skilled person to select suitable solvents and prepare OSC coating or printing inks, without the need to use e.g. thickening agents to adjust the viscosity. If desired, coating or printing inks made from these solvents can also be diluted down with lower viscosity solvents to tune the viscosities as needed. Although the use of viscosity enhancing or modifying additives is not necessarily required, they may be added in small amounts so as not to adversely affect the device performance.

SUMMARY OF THE INVENTION

The invention relates to a method of preparing an OSC formulation, comprising the step of dissolving an organic semiconducting (OSC) compound in a solvent or in a solvent blend comprising two or more solvents, wherein the solvents are selected such that they fulfil the following conditions:

the partition ratio log P of the solvent, or the weighted average of the partition ratio (log P)$_w$ of the solvent blend, without any additives, is >1.5, the viscosity of the solvent or the solvent blend, without any additives, is >10 cP at 25° C., and the boiling temperature of the solvent, or in case of a solvent blend the boiling temperature of the highest boiling solvent of the solvent blend, without any additives, is <400° C. at a pressure of 1 Torr.

The invention further relates to a formulation obtainable or obtained by this method.

The invention further relates to a formulation comprising an OSC compound and an organic solvent or a solvent blend of two or more organic solvents, characterized in that the partition ratio log P of the solvent, or the weighted average of the partition ratio (log P)$_w$ of the solvent blend, without any additives, is >1.5, the viscosity of the solvent or the solvent blend, without any additives, is >10 cP at 25° C., and the boiling temperature of the solvent or the solvent blend, without any additives, is <400° C. at a pressure of 1 Torr.

The invention further relates to the use of a formulation as described above and below as coating or printing ink and/or for the preparation of OE devices, in particular for OFETs and OPV cells, very preferably for flexible devices of these types.

The invention further relates to a process of preparing an organic electronic (OE) device, comprising the steps of a) depositing a formulation as described above and below onto a substrate, b) removing the solvent(s), for example by evaporation.

The invention further relates to an OE device prepared from a formulation and/or by a process as described above and below.

The OE devices include, without limitation, organic field effect transistors (OFET), integrated circuits (IC), thin film transistors (TFT), Radio Frequency Identification (RFID) tags, organic light emitting diodes (OLED), organic light emitting transistors (OLET), electroluminescent displays, organic photovoltaic (OPV) cells, organic solar cells (O-SC), flexible OPVs and O-SCs, organic laser diodes (O-laser), organic integrated circuits (O-IC), lighting devices, sensor devices, electrode materials, photoconductors, photodetectors, electrophotographic recording devices, capacitors, charge injection layers, Schottky diodes, planarising layers, antistatic films, conducting substrates, conducting patterns, photoconductors, electrophotographic devices, organic memory devices, biosensors and biochips.

TERMS AND DEFINITIONS

Unless the context clearly indicates otherwise, as used herein plural forms of the terms herein are to be construed as including the singular form and vice versa.

Throughout the description and claims of this specification, the words "comprise" and "contain" and variations of the words, for example "comprising" and "comprises", mean "including but not limited to", and are not intended to (and do not) exclude other components.

The term "polymer" includes homopolymers and copolymers, e.g. statistical, alternating or block copolymers. In addition, the term "polymer" as used hereinafter does also include dendrimers, which are typically branched macromolecular compounds consisting of a multifunctional core group onto which further branched monomers are added in a regular way giving a tree-like structure, as described for example in M. Fischer and F. Vögtle, *Angew. Chem., Int.* Ed. 1999, 38, 885.

The term "conjugated polymer" means a polymer containing in its backbone (or main chain) mainly C atoms with sp$^2$-hybridisation, or optionally sp-hybridisation, which may also be replaced by hetero atoms, enabling interaction of one π-orbital with another across an intervening σ-bond. In the simplest case this is for example a backbone with alternating carbon-carbon (or carbon-hetero atom) single and multiple (e.g. double or triple) bonds, but does also include polymers with units like 1,3-phenylene. "Mainly" means in this connection that a polymer with naturally (spontaneously) occurring defects, which may lead to interruption of the conjugation, is still regarded as a conjugated polymer. Also included in this meaning are polymers wherein the backbone comprises for example units like aryl amines, aryl phosphines and/or certain heterocycles (i.e. conjugation via N-, O-, P- or S-atoms) and/or metal organic complexes (i.e. conjugation via a metal atom). The term "conjugated linking group" means a group connecting two rings (usually aromatic rings) consisting of C atoms or hetero atoms with sp$^2$-hybridisation or sp-hybridisation. See also "IUPAC Compendium of Chemical terminology, Electronic version".

Unless stated otherwise, the molecular weight is given as the number average molecular weight $M_n$ or as weight average molecular weight $M_w$, which unless stated otherwise are determined by gel permeation chromatography (GPC) against polystyrene standards.

The degree of polymerization (n) means the number average degree of polymerization, unless stated otherwise given as n=$M_n/M_u$, wherein $M_u$ is the molecular weight of the single repeating unit.

"Small molecule" means a monomeric, i.e. non-polymeric compound.

Unless stated otherwise, percentages of solids are per cent by weight ("wt. %"), percentages or ratios of liquids (like e.g. in solvent mixtures) are percent by volume ("vol. %"), and temperatures are given in degrees Celsius (° C.), "room temperature (RT)" means 25° C., "b.p." means boiling point, "atmospheric pressure" means 760 Torr or 1013 hPa.

The term "volatile" means compounds or additives that can be removed from the OSC material by evaporation, after the OSC material has been deposited onto a substrate or an OE device, under conditions (like temperature and/or reduced pressure) that do not significantly damage the OSC material or the OE device. Preferably this means that the additive has a boiling point or sublimation temperature of <300° C., more preferably ≤135° C., most preferably ≤120° C., at the pressure employed, very preferably at atmospheric pressure (1013 hPa). The term "non-volatile" means compounds or additives that are not volatile in the meaning as described above.

The partition ratio log P (in the literature also referred to as "partition coefficient") of a compound or solvent is given by equation (1)

$$\log P = \log([A]_{oct}/[A]_{aq}) \quad (1)$$

wherein $[A]_{oct}$ is the concentration of the compound or solvent in octanol and $[A]_{aq}$ is the concentration of the compound or solvent in water.

(See IUPAC Compendium of Chemical Terminology, Electronic version, http://goldbook.iupac.org/P04440.html, PAC 1993, 65, 2385, and C. Hansch, Acc. Chem. Res. 2, 232, (1969)).

In case of a solvent blend, which comprises two or more solvents, the partition ratio of the blend is defined as the weighted average (log P)$_w$ of the partition ratios of all solvents contained in the blend, as given by equation (2)

$$(\log P)_w = \sum_{i=1}^{n} w_i \log P_i \quad (2)$$

with n being the number of solvents, log $P_i$ being the log P value of a single solvent in the solvent blend, and $w_i$ being the weight fraction (concentration in % by weight/100) of said solvent in the solvent blend.

The log P values are measured by measuring the concentration in each phase (e.g. by GC, HPLC, UV/vis etc.) after equilibrating a dilute solution in equal volumes of water and octanol, or alternatively log P is calculated by molecular calculation using "Chem Bio Draw Ultra version 11.0 (2007)" software, produced and marketed by Cambridge Soft., unless stated otherwise.

The viscosity values are measured with a parallel plate rotational viscometer or rheometer (TA Instruments) at a sheer rate of 500 s$^{-1}$, unless stated otherwise.

The values of the surface tension are measured by drop shape analysis using FTA surface tension instrument, unless stated otherwise.

Unless stated otherwise, above and below all phyiscal properties and values refer to a temperature of 25° C.

DETAILED DESCRIPTION OF THE INVENTION

The method according to the present invention allows to identify specific solvents and solvent blends, preferably selected from organic solvents, which both dissolve the OSC compound at useful levels and have viscosities which are in a range that is suitable for printing methods, preferably in the range from 10 to 700 cP, more preferably from 10 to 630 cP at room temperature (25° C.).

Inks made up from these solvents can then be diluted down with lower viscosity solvents, if desired, to tune the viscosities as needed, as long as the viscosity of the entire solvent blend is >10 cP.

The key parameters of the formulation are as follows:
the solvent or solvent blend, without any additives, has a viscosity of >10 cP at 25° C., and
the solvent, or in case of a solvent blend the highest boiling solvent of the solvent blend, has a boiling point <400° C. at 1 Torr, and
the logarithm of the partition ratio log P of the solvent, or the weighted average of the partition ratio (log P)$_w$ of the solvent blend is >1.5, as calculated by "Chem Bio Draw Ultra version 11.0 (2007)" software, produced and marketed by Cambridge Soft., and
preferably the OSC compound is dissolved in the solvent or solvent blend at a concentration from 0.005 to 50% by weight.

To enhance the properties of the formulation optionally one or more of the following additives are added:
a) one or more viscosity enhancers, preferably at a concentration where they do not negatively affect device performance,
b) one or more surfactants,
c) one or more polymers that modify the physical properties, electrical properties or stability of the printed formulation.

The concentration of the viscosity enhancers a) is preferably 0.001 to 200 wt. % relative to the amount of the OSC compound. Preferably one or more polymers are added as viscosity enhancer to raise the viscosity further. Suitable and preferred polymers are selected from the group consisting of organic solvent soluble polymers, like for example homo- or copolymers of low $M_w$ polyethylene, low $M_w$ polypropylene, other hydrocarbon back bone polymers, polybutadiene, polyethylene and propylene oxide, polystyrene, alpha methyl polystyrene, associative thickeners, Septon® polymers like e.g. Septon® 4099 (available from Kuraray America Inc.), polytriarylamines, or the polymers that are disclosed in US 2007/0102696 A1 for use as binders.

The concentration of the surfactants b) is preferably from 0.001 to 1.0 wt. %, very preferably from 0.05 to 0.5 wt. % relative to the total composition The main aim of these surfactants is to reduce the surface energy of the solution in order to allow improved wetting. Suitable and preferred surfactants include, without limitation, those selected from the group consisting of fluorocarbons, fluoro modified products, silicone based products, acetylenic diols and polyacrylates, or other products like alcohol alkoxylates. Many of these surfactants are commercially available, for example under the name "Fluor®" (from Cytonics), "Zonyl®" (from Dow), "Byk®" (from Byk Chemie/Altana), "Tego®" (from Tego/Evonik), or "Surfynol®" (from Air Products). Examples of fluorocarbon surfactants include, without limitation, Fluor N361 or 362, Zonyl FSG (a fluorinated methacrylate polymer), Zonyl FSN100 (an ethoxylated nonionic fluorosurfactant) and the like. Examples of fluoro modified surfactants are Byk 388 (a fluoro modified polyacrylate), Byk 340 (a polymeric fluorosurfactant) and the like. Examples of silicone based surfactants include, without limitation, Tego Wet 270 (a polyether siloxane copolymer), Tego Wet KL245 (a polyether siloxane copolymer), Tego Twin 4000 (a siloxane based Gemini surfactant), Byk 307 (a polyether modified dimethylpolysiloxane copolymer), Byk 310 (a polyester modified dimethylpolysiloxane), Byk 331 (a polyether modified dimethylpolysiloxane copolymer) and the like. Examples of acetylenic diols include, without limitation, Surfynol 104 and the like. Examples of polyacrylate surfactants include, without limitation, Byk 361 N and the like. Examples for other products include, without limitation, Byk Dynwet 800 (an alcohol alkoxylate) and the like.

The concentration of the polymers c) modifying the physical properties is preferably 0.001 to 200 wt. % relative to the amount of the OSC compound. Preferably these polymers are selected from the same group of polymers as the viscosity enhancers a) mentioned above.

The formulation can also be a "hot melt" type ink, i.e. it is a liquid at the jetting or printing temperature, but solid at room temperature.

Preferably the solvent is capable of being evaporated or sublimed at atmospheric pressure or reduced pressure (down to $10^{-7}$ Torr) and/or heat (up to 500° C.), as needed to leave essentially no residue. The boiling point of the solvent, or of the highest boiling solvent of the solvent blend, is <400° C. at 1 Torr and preferably at atmospheric pressure, more preferably <300° C. at 1 Torr and preferably at atmospheric pressure, or preferably <200° C. at 20 Torr.

Further preferably the boiling point of the solvent, or of the lowest boiling solvent of the solvent blend, is ≥130° C. and more preferably >130° C. at atmospheric pressure.

The viscosity of the solvent at 25° C. is >10 cP, if the solvent is liquid at 25° C. The viscosity of the solvent blend at 25° C. is >10 cP. Preferably the solvent or solvent blend has a viscosity of >15 cP at 25° C., more preferably of >20 cP at 25° C., most preferably of >50 cP at 25° C.

The partition ratio (log P) of the solvent, or the calculated value of the weighted average of the partition ratio (log P)$_w$ of the solvent blend is >1.5, more preferably >2 and most preferably >2.5. Preferably these values relate to the calculated log P for each solvent.

Preferably the surface tension of the solvent or solvent blend, without any additives, is >15 dyne/cm and <80 dyne/cm, more preferably >25 dyne/cm and <60 dyne/cm.

The formulation or ink according to the present invention can be used to apply functional materials like OSC compounds to a substrate or onto a device by coating or printing methods like flexographic printing, gravure printing, ink jet printing, micro-contact printing, soft lithography, stamping etc. Most preferably the inks are used in flexographic, gravure or ink jet printing.

The size of the printed features can range from lines or dots of about 1 micron diameter or even less, respectively, to large areas in the range of several m², preferably from 10 microns to 1 m². The thickness of the printed OSC layer is most preferably from 50 to 300 nm.

Optionally the formulation comprises one or more additives that increase the viscosity of the formulation (viscosity enhancers). For example, small amounts, preferably 0.001 to 200 wt. % relative to the amount of the OSC compound, of one or more polymers are optionally added to raise the viscosity further. Suitable and prefered polymers include for example polystyrene, Septon® polymers like e.g. Septon® 4099 (available from Kuraray America Inc.), polytriarylamines, etc., or the polymers that are disclosed in US 2007/0102696 A1 for use as binders. Preferably, however, the formulation does not contain any non-volatile additives apart from the OSC compound(s).

The solvents can generally be selected from any chemical class that meets the physical criteria mentioned above, including, but not limited to, aliphatic or aromatic hydrocarbons, amines, thiols, amides, esters, ethers, polyethers, alcohols, diols and polyols. Suitable and preferred solvents include for example 1-cyclohexyl-2-pyrrolidinone (N-cyclohexyl-pyrrolidinone), methylated benzenes like o-, m- or p-xylene, terpenoids like α-terpineol, menthol or carveol, naphthols like decahydro-2-naphthol or 1,2,3,4-tetrahydro-1-naphthol, and methylated alicyclic alcohols like 3- or 4-methylcyclohexanol or 2,5-dimethylcyclohexanol.

Preferred solvents with high viscosity include for example decahydro-2-naphthol and 1,2,3,4-tetrahydro-1-naphthol. Suitable solvents with low viscosity, that can be used as diluters, include for example methylated benzenes like o-, m- or p-xylene, tetralin and decalin.

Especially preferred is a solvent blend comprising one or more solvents selected from a high viscosity group and one or more solvents selected from a low viscosity group. The high viscosity group consists of solvents having a viscosity at 25° C. of >10 cP, preferably >50 cP, and <10 000 cP, preferably <5000 cP, including, but not limited to, solvents like decahydro-2-naphthol and 1,2,3,4-tetrahydro-1-naphthol. The low viscosity group consists of solvents having a viscosity at 25° C. of >0.25 cP, preferably >0.5 cP, and <10 cP, including, but not limited to, solvents like tetralin, decalin, and methylated benzenes, like for example o-, m- or p-xylene.

Most preferred are binary blends o-xylene/decahydro-2-naphthol with a ratio from 5/95 to 40/60, furthermore binary blends tetralin/1,2,3,4-tetrahydro-1-naphthol with a ratio from 25/75 to 50/50, furthermore binary blends decalin/decahydro-2-naphthol with a ratio from 25/75 to 50/50 (all ratios given in wt. %), especially the binary blends shown in Table 1 of Example 1.

The OSC compounds can be selected from standard materials that are known to the person skilled in the art and are described in the literature.

The OSC compound may be any conjugated aromatic molecule containing at least three aromatic rings. The OSC compounds preferably contain 5, 6 or 7 membered aromatic rings, and more preferably contain 5 or 6 membered aromatic rings. The material may be a monomer, oligomer or polymer, including mixtures, dispersions and blends.

Each of the aromatic rings optionally contains one or more hetero atoms selected from Se, Te, P, Si, B, As, N, O or S, preferably from N, O or S.

The aromatic rings may be optionally substituted with alkyl, alkoxy, polyalkoxy, thioalkyl, acyl, aryl or substituted aryl groups, halogen, particularly fluorine, cyano, nitro or an optionally substituted secondary or tertiary alkylamine or arylamine represented by —N($R^x$)($R^y$), where $R^x$ and $R^y$ independently of each other denote H, optionally substituted alkyl, optionally substituted aryl, alkoxy or polyalkoxy groups. Where $R^x$ and/or $R^y$ denote alkyl or aryl these may be optionally fluorinated.

The rings may be optionally fused or may be linked with a conjugated linking group such as —C($T^1$)=C($T^2$)—, —C≡C— —N($R^z$)—, —N=N—, ($R^z$)C=N—, —N=C($R^z$)—, wherein $T^1$ and $T^2$ independently of each other denote H, Cl, F, —C≡N— or a lower alkyl group, preferably a $C_{1-4}$ alkyl group, and $R^z$ denotes H, optionally substituted alkyl or optionally substituted aryl. Where $R^z$ is alkyl or aryl these may be optionally fluorinated.

Preferred OSC compounds include small molecules (i.e. monomeric compounds), polymers, oligomers and derivatives thereof, selected from conjugated hydrocarbon polymers such as polyacene, polyphenylene, poly(phenylene vinylene), polyfluorene including oligomers of those conjugated hydrocarbon polymers; condensed aromatic hydrocarbons such as tetracene, chrysene, pentacene, pyrene, perylene, coronene, or soluble substituted derivatives of these; oligomeric para substituted phenylenes such as p-quaterphenyl (p-4P), p-quinquephenyl (p-5P), p-sexiphenyl (p-6P), or soluble substituted derivatives of these; conjugated heterocyclic polymers such as poly(3-substituted thiophene), poly(3,4-bisubstituted thiophene), polybenzothiophene, polyisothianapthene, poly(N-substituted pyrrole), poly(3-substituted pyrrole), poly(3,4-bisubstituted pyrrole), polyfuran, polypyridine, poly-1,3,4-oxadiazoles, polyisothianaphthene, poly(N-substituted aniline), poly(2-substituted aniline), poly(3-substituted aniline), poly(2,3-bisubstituted aniline), polyazulene, polypyrene; pyrazoline compounds; polyselenophene; polybenzofuran; polyindole; polypyridazine; benzidine compounds; stilbene compounds; triazines; substituted metallo- or metal-free porphines, phthalocyanines, fluorophthalocyanines, naphthalocyanines or fluoronaphthalocyanines; $C_{60}$ and $C_{70}$ fullerenes or derivatives thereof; N,N'-dialkyl, substituted dialkyl, diaryl or substituted diaryl-1,4,5,8-naphthalenetetracarboxylic diimide and fluoro derivatives; N,N'-dialkyl, substituted dialkyl, diaryl or substituted diaryl 3,4,9,10-perylenetetracarboxylicdiimide; bathophenanthroline; diphenoquinones; 1,3,4-oxadiazoles; 11,11,12,12-tetracyanonaptho-2,6-quinodimethane; α,α'-bis(dithieno[3,2-b2',3'-d]thiophene); 2,8-dialkyl, substituted dialkyl, diaryl or substituted diaryl anthradithiophene; 2,2'-bibenzo[1,2-b:4,5-b']dithiophene. Preferred compounds are those from the above list and derivatives thereof which are soluble.

Preferred OSC compounds are small molecules (i.e. monomeric compounds).

Especially preferred OSC compounds are substituted polyacenes, such as 6,13-bis(trialkylsilylethynyl)pentacene or derivatives thereof, as described for example in U.S. Pat. No. 6,690,029 or US 2007/0102696 A1.

Further preferred OSC compounds are poly(3-substituted thiophenes), very preferably poly(3-alkylthiophenes) (P3AT) wherein the alkyl group is preferably straight-chain and preferably has 1 to 12, most preferably 4 to 10 C-atoms, like e.g. poly(3-hexylthiophene).

Particularly preferred OSC compounds are selected from formula I (polyacenes):

I wherein each of $R^1$, $R^2$, $R^3$, $R^4$, $R^5$, $R^6$, $R^7$, $R^8$, $R^9$, $R^{10}$, $R^{11}$ and $R^{12}$, which may be the same or different, independently represents hydrogen; an optionally substituted $C_1$-$C_{40}$ carbyl or hydrocarbyl group; an optionally substituted $C_1$-$C_{40}$ alkoxy group; an optionally substituted $C_6$-$C_{40}$ aryloxy group; an optionally substituted $C_7$-$C_{40}$ alkylaryloxy group; an optionally substituted $C_2$-$C_{40}$ alkoxycarbonyl group; an optionally substituted $C_7$-$C_{40}$ aryloxycarbonyl group; a cyano group (—CN); a carbamoyl group (—C(=O)NH$_2$); a haloformyl group (—C(=O)—X, wherein X represents a halogen atom); a formyl group (—C(=O)—H); an isocyano group; an isocyanate group; a thiocyanate group or a thioisocyanate group; an optionally substituted amino group; a hydroxy group; a nitro group; a CF$_3$ group; a halo group (Cl, Br, F); or an optionally substituted silyl or alkynylsilyl group; and wherein independently each pair of R$^1$ and R$^2$, R$^2$ and R$^3$, R$^3$ and R$^4$, R$^7$ and R$^8$, R$^8$ and R$^9$, R$^9$ and R$^{10}$, is optionally cross-bridged to form a C$_4$-C$_{40}$ saturated or unsaturated ring, which saturated or unsaturated ring may be intervened by an oxygen atom, a sulphur atom or a group of the formula —N(R$^a$)— (wherein R$^a$ is a hydrogen atom or an optionally substituted hydrocarbon group), or may optionally be substituted; and wherein one or more of the carbon atoms of the polyacene skeleton may optionally be substituted by a heteroatom selected from N, P, As, O S, Se and Te; and wherein independently any two or more of the substituents R$^1$-R$^{12}$ which are located on adjacent ring positions of the polyacene may, together, optionally constitute a further C$_4$-C$_{40}$ saturated or unsaturated ring optionally intervened by O, S or —N(R$^a$) where R$^a$ is as defined above) or an aromatic ring system, fused to the polyacene; and wherein n is 0, 1, 2, 3 or 4 preferably n is 0, 1 or 2, most preferably n is 0 or 2, meaning that the polyacene compound is a pentacene compound (if n=2) or a "pseudo pentacene" compound (if n=0).

Very preferred compounds of formula are those of subformula I1 (substituted pentacenes):

I1 wherein R$^1$, R$^2$, R$^3$, R$^4$, R$^7$, R$^8$, R$^9$, R$^{10}$, R$^{15}$, R$^{16}$, R$^{17}$ each independently are the same or different and each independently represents: H; an optionally substituted C$_1$-C$_{40}$ carbyl or hydrocarbyl group; an optionally substituted C$_1$-C$_{40}$ alkoxy group; an optionally substituted C$_6$-C$_{40}$ aryloxy group; an optionally substituted C$_7$-C$_{40}$ alkylaryloxy group; an optionally substituted C$_2$-C$_{40}$ alkoxycarbonyl group; an optionally substituted C$_7$-C$_{40}$ aryloxycarbonyl group; a cyano group (—CN); a carbamoyl group (—C(=O)NH$_2$); a haloformyl group (—C(=O)—X, wherein X represents a halogen atom); a formyl group (—C(=O)—H); an isocyano group; an isocyanate group; a thiocyanate group or a thioisocyanate group; an optionally substituted amino group; a hydroxy group; a nitro group; a CF$_3$ group; a halo group (Cl, Br, F); or an optionally substituted silyl group; and A represents Silicon or Germanium; and wherein independently each pair of R$^1$ and R$^2$, R$^2$ and R$^3$, R$^3$ and R$^4$, R$^7$ and R$^8$, R$^8$ and R$^9$, and R$^{10}$, R$^{15}$ and R$^{16}$, and R$^{16}$ and R$^{17}$ is optionally cross-bridged with each other to form a C$_4$-C$_{40}$ saturated or unsaturated ring, which saturated or unsaturated ring is optionally intervened by an oxygen atom, a sulphur atom or a group of the formula —N(R$^a$)— (wherein R$^a$ is a hydrogen atom or a hydrocarbon group), or is optionally substituted; and wherein one or more of the carbon atoms of the polyacene skeleton is optionally substituted by a heteratom selected from N, P, As, O, S, Se and Te, characterized in that a) at least one of R$^1$, R$^2$, R$^3$, R$^4$, R$^7$, R$^8$, R$^9$, R$^{10}$ is an optionally substituted C$_1$-C$_{40}$ carbyl or hydrocarbyl group; an optionally substituted C$_1$-C$_{40}$ alkoxy group; an optionally substituted C$_6$-C$_{40}$ aryloxy group; an optionally substituted C$_7$-C$_{40}$ alkylaryloxy group; an optionally substituted C$_2$-C$_{40}$ alkoxycarbonyl group; an optionally substituted C$_7$-C$_{40}$ aryloxycarbonyl group; a cyano group (—CN); a carbamoyl group (—C(=O)NH$_2$); a haloformyl group (—C(=O)—X, wherein X represents a halogen atom); a formyl group (—C(=O)—H); an isocyano group; an isocyanate group; a thiocyanate group or a thioisocyanate group; an optionally substituted amino group; a hydroxy group; a nitro group; a CF$_3$ group; a halo group (Cl, Br, F); or an optionally substituted silyl group, and/or b) at least one pair of R$^1$ and R$^2$, R$^2$ and R$^3$, R$^3$ and R$^4$, R$^7$ and R$^8$, R$^8$ and R$^9$, R$^9$ and R$^{10}$ is cross-bridged with each other to form a C$_4$-C$_{40}$ saturated or unsaturated ring, which saturated or unsaturated ring is optionally intervened by an oxygen atom, a sulphur atom or a group of the formula —N(R$^a$)— (wherein R$^a$ is a hydrogen atom or a hydrocarbon group), or is optionally substituted.

Further preferred compounds of formula are those of subformula I2 (substituted heteroacenes):

I2 wherein R$^2$, R$^3$, R$^8$, R$^9$, R$^{15}$, R$^{16}$, R$^{17}$ each independently are the same or different and each independently represents: H; an optionally substituted C$_1$-C$_{40}$ carbyl or hydrocarbyl group; an optionally substituted C$_1$-C$_{40}$ alkoxy group; an optionally substituted C$_6$-C$_{40}$ aryloxy group; an optionally substituted C$_7$-C$_{40}$ alkylaryloxy group; an optionally substituted C$_2$-C$_{40}$ alkoxycarbonyl group; an optionally substituted C$_7$-C$_{40}$ aryloxycarbonyl group; a cyano group (—CN); a carbamoyl group (—C(=O)NH$_2$); a haloformyl group (—C(=O)—X, wherein X represents a halogen atom); a formyl group (—C(=O)—H); an isocyano group; an isocyanate group; a thiocyanate group or a thioisocyanate group; an optionally substituted amino group; a hydroxy group; a nitro group; a CF$_3$ group; a halo group (Cl, Br, F); or an optionally substituted silyl group; and A represents Silicon or Germanium; and wherein independently each pair of R$^2$ and R$^3$, R$^8$ and R$^9$, R$^{15}$ and R$^{16}$, and R$^{16}$ and R$^{17}$ is optionally cross-bridged with each other to form a C$_4$-C$_{40}$ saturated or unsaturated ring, which saturated or unsaturated ring is optionally intervened by an oxygen atom, a sulphur atom or a group of the formula —N(R$^a$)— (wherein R$^a$ is a hydrogen atom or a hydrocarbon group), and is optionally substituted; and wherein one or more of the carbon atoms of the polyacene skeleton is optionally substituted by a heteroatom selected from N, P, As, O, S, Se and Te, characterized in that at least one pair of R$^2$ and R$^3$, and R$^8$ and R$^9$ is cross-bridged with each other to form a C$_4$-C$_{40}$ saturated or unsaturated ring that is intervened by an oxygen atom, a sulphur atom or a group of the formula —N(R$^a$)— (wherein R$^a$ is a hydrogen atom or a hydrocarbon group), and is optionally substituted.

Further preferred compounds of formula I are those of subformula I3 (silylethynylated heteroacenes):

I3 wherein
one of Y$^1$ and Y$^2$ denotes —CH= or =CH— and the other denotes —X—,
one of Y$^3$ and Y$^4$ denotes —CH= or =CH— and the other denotes —X—, X is —O—, —S—, —Se— or —NR'''—,
R is, in case of multiple occurrence independently of one another, cyclic, straight-chain or branched alkyl or alkoxy that have 1 to 20, preferably 1 to 8 C-atoms, or aryl having 2-30 C-atoms, all of which are optionally fluorinated or perfluorinated, with SiR$_3$ preferably being trialkylsilyl,
R' is H, F, Cl, Br, I, CN, straight-chain or branched alkyl or alkoxy that have 1 to 20, preferably 1 to 8 C-atoms and are optionally fluorinated or perfluorinated, optionally fluorinated or perfluorinated aryl having 6 to 30 C-atoms, preferably C$_6$F$_5$, or CO$_2$R'', with R'' being H, optionally fluorinated alkyl having 1 to 20 C-atoms, or optionally fluorinated aryl having 2 to 30, preferably 5 to 20 C-atoms,
R''' is H or cyclic, straight-chain or branched alkyl with 1 to 10 C-atoms, preferably H,
m is 0 or 1,
o is 0 or 1,
with the proviso that, if X is S, R' is not hydrogen.

Especially preferred are compounds of formula I3 wherein m and n are 0, and/or X is S, and/or R' is F.

The term "carbyl group" as used above and below denotes any monovalent or multivalent organic radical moiety which comprises at least one carbon atom either without any non-carbon atoms (like for example —C≡C—), or optionally combined with at least one non-carbon atom such as N, O, S, P, Si, Se, As, Te or Ge (for example carbonyl etc.). The term "hydrocarbyl group" denotes a carbyl group that does additionally contain one or more H atoms and optionally contains one or more hetero atoms like for example N, O, S, P, Si, Se, As, Te or Ge.

A carbyl or hydrocarbyl group comprising a chain of 3 or more C atoms may also be straight-chain, branched and/or cyclic, including spiro and/or fused rings.

Preferred carbyl and hydrocarbyl groups include alkyl, alkoxy, alkylcarbonyl, alkoxycarbonyl, alkylcarbonyloxy and alkoxycarbonyloxy, each of which is optionally substituted and has 1 to 40, preferably 1 to 25, very preferably 1 to 18 C atoms, furthermore optionally substituted aryl or aryloxy having 6 to 40, preferably 6 to 25 C atoms, furthermore alkylaryloxy, arylcarbonyl, aryloxycarbonyl, arylcarbonyloxy and aryloxycarbonyloxy, each of which is optionally substituted and has 6 to 40, preferably 7 to 40 C atoms, wherein all these groups optionally contain one ore more hetero atoms, especially selected from N, O, S, P, Si, Se, As, Te and Ge.

The carbyl or hydrocarbyl group may be a saturated or unsaturated acyclic group, or a saturated or unsaturated cyclic group. Unsaturated acyclic or cyclic groups are preferred, especially aryl, alkenyl and alkynyl groups (especially ethynyl). Where the C$_1$-C$_{40}$ carbyl or hydrocarbyl group is acyclic, the group may be straight-chain or branched. The C$_1$-C$_{40}$ carbyl or hydrocarbyl group includes for example: a C$_1$-C$_{40}$ alkyl group, a C$_2$-C$_{40}$ alkenyl group, a C$_2$-C$_{40}$ alkynyl group, a C$_3$-C$_{40}$ allyl group, a C$_4$-C$_{40}$ alkyldienyl group, a C$_4$-C$_{40}$ polyenyl group, a C$_6$-C$_{18}$ aryl group, a C$_6$-C$_{40}$ alkylaryl group, a C$_6$-C$_{40}$ arylalkyl group, a C$_4$-C$_{40}$ cycloalkyl group, a C$_4$-C$_{40}$ cycloalkenyl group, and the like. Preferred among the foregoing groups are a C$_1$-C$_{20}$ alkyl group, a C$_2$-C$_{20}$ alkenyl group, a C$_2$-C$_{20}$ alkynyl group, a C$_3$-C$_{20}$ allyl group, a C$_4$-C$_{20}$ alkyldienyl group, a C$_6$-C$_{12}$ aryl group and a C$_4$-C$_{20}$ polyenyl group, respectively. Also included are combinations of groups having carbon atoms and groups having hetero atoms, like e.g. an alkynyl group, preferably ethynyl, that is substituted with a silyl group, preferably a trialkylsilyl group.

Aryl and heteroaryl preferably denote a mono-, bi- or tri-cyclic aromatic or heteroaromatic group with up to 25 C atoms that may also comprise condensed rings and is optionally substituted with one or more groups L, wherein L is halogen or an alkyl, alkoxy, alkylcarbonyl or alkoxycarbonyl group with 1 to 12 C atoms, wherein one or more H atoms may be replaced by F or Cl.

Especially preferred aryl and heteroaryl groups are phenyl in which, in addition, one or more CH groups may be replaced by N, naphthalene, thiophene, selenophene thienothiophene, dithienothiophene, fluorene and oxazole, all of which can be unsubstituted, mono- or polysubstituted with L as defined above.

In formula I and its subformulae R$^{1-17}$ preferably denote straight chain, branched or cyclic alkyl with 1 to 20 C-atoms, which is unsubstituted or mono- or polysubstituted by F, Cl, Br or I, and wherein one or more non-adjacent CH$_2$ groups are optionally replaced, in each case independently from one another, by —O—, —S—, —NR$^o$—, —SiR$^o$R$^{oo}$—, —CX$^1$=CX$^2$— or —C≡C— in such a manner that O and/or S atoms are not linked directly to one another, or denotes optionally substituted aryl or heteroaryl preferably having 1 to 30 C-atoms, with $R^0$ and $R^{00}$ being independently of each other H or alkyl with 1 to 12 C-atoms, and $X^1$ and $X^2$ being independently of each other H, F, Cl or CN.

If one of $R^{1-17}$ is an alkyl or alkoxy radical, i.e. where the terminal $CH_2$ group is replaced by —O—, this may be straight-chain or branched. It is preferably straight-chain, has 2 to 8 carbon atoms and accordingly is preferably ethyl, propyl, butyl, pentyl, hexyl, heptyl, octyl, ethoxy, propoxy, butoxy, pentoxy, hexyloxy, heptoxy, or octoxy, furthermore methyl, nonyl, decyl, undecyl, dodecyl, tridecyl, tetradecyl, pentadecyl, nonoxy, decoxy, undecoxy, dodecoxy, tridecoxy or tetradecoxy, for example. Especially preferred are n-hexyl and n-dodecyl.

If one of $R^{1-17}$ is an alkyl group wherein one or more $CH_2$ groups are replaced by —CH=CH—, this may be straight-chain or branched. It is preferably straight-chain, has 2 to 12 C-atoms and accordingly is preferably vinyl, prop-1-, or prop-2-enyl, but-1-, 2- or but-3-enyl, pent-1-, 2-, 3- or pent-4-enyl, hex-1-, 2-, 3-, 4- or hex-5-enyl, hept-1-, 2-, 3-, 4-, 5- or hept-6-enyl, oct-1-, 2-, 3-, 4-, 5-, 6- or oct-7-enyl, non-1-, 2-, 3-, 4-, 5-, 6-, 7- or non-8-enyl, dec-1-, 2-, 3-, 4-, 5-, 6-, 7-, 8- or dec-9-enyl, undec-1-, 2-, 3-, 4-, 5-, 6-, 7-, 8-, 9- or undec-10-enyl, dodec-1-, 2-, 3-, 4-, 5-, 6-, 7-, 8-, -9, -10 or undec-11-enyl. The alkenyl group may comprise C=C-bonds with E- or Z-configuration or a mixture thereof.

If one of $R^{1-17}$ is oxaalkyl, i.e. where one $CH_2$ group is replaced by —O—, is preferably straight-chain 2-oxapropyl (=methoxymethyl), 2-(=ethoxymethyl) or 3-oxabutyl (=2-methoxyethyl), 2-, 3-, or 4-oxapentyl, 2-, 3-, 4-, or 5-oxahexyl, 2-, 3-, 4-, 5-, or 6-oxaheptyl, 2-, 3-, 4-, 5-, 6- or 7-oxaoctyl, 2-, 3-, 4-, 5-, 6-, 7- or 8-oxanonyl or 2-, 3-, 4-, 5-, 6-, 7-, 8- or 9-oxadecyl, for example.

If one of $R^{1-17}$ is thioalkyl, i.e where one $CH_2$ group is replaced by —S—, is preferably straight-chain thiomethyl (—SCH$_3$), 1-thioethyl (—SCH$_2$CH$_3$), 1-thiopropyl (=—SCH$_2$CH$_2$CH$_3$), 1-(thiobutyl), 1-(thiopentyl), 1-(thiohexyl), 1-(thioheptyl), 1-(thiooctyl), 1-(thiononyl), 1-(thiodecyl), 1-(thioundecyl) or 1-(thiododecyl), wherein preferably the $CH_2$ group adjacent to the $sp^2$ hybridised vinyl carbon atom is replaced.

If one of $R^{1-17}$ is fluoroalkyl, it is preferably straight-chain perfluoroalkyl $C_iF_{2i+1}$, wherein i is an integer from 1 to 15, in particular $CF_3$, $C_2F_5$, $C_3F_7$, $C_4F_9$, $C_5F_{11}$, $C_6F_{13}$, $C_7F_{15}$ or $C_8F_{17}$, very preferably $C_6F_{13}$.

Very preferably $R^{1-17}$ are selected from $C_1$-$C_{20}$-alkyl that is optionally substituted with one or more fluorine atoms, $C_1$-$C_{20}$-alkenyl, $C_1$-$C_{20}$-alkynyl, $C_1$-$C_{20}$-alkoxy, $C_1$-$C_{20}$-thioalkyl, $C_1$-$C_{20}$-silyl, $C_1$-$C_{20}$-amino or $C_1$-$C_{20}$-fluoroalkyl, in particular from alkenyl, alkynyl, alkoxy, thioalkyl or fluoroalkyl, all of which are straight-chain and have 1 to 12, preferably 5 to 12 C-atoms, most preferably pentyl, hexyl, heptyl, octyl, nonyl, decyl, undecyl or dodecyl.

—$CX^1$=$CX^2$— is preferably —CH=CH—, —CF=CF— or —CH=C(CN)—.

$R^{15-17}$ are preferably identical or different groups selected from a $C_1$-$C_{40}$-alkyl group, preferably $C_1$-$C_4$-alkyl, most preferably methyl, ethyl, n-propyl or isopropyl, a $C_6$-$C_{40}$-aryl group, preferably phenyl, a $C_6$-$C_{40}$-arylalkyl group, a $C_1$-$C_{40}$-alkoxy group, or a $C_6$-$C_{40}$-arylalkyloxy group, wherein all these groups are optionally substituted for example with one or more halogen atoms. Preferably, $R^{16-17}$ are each independently selected from optionally substituted $C_{1-12}$-alkyl, more preferably $C_{1-4}$-alkyl, most preferably $C_{1-3}$-alkyl, for example isopropyl, and optionally substituted $C_{6-10}$-aryl, preferably phenyl. Further preferred is a silyl group of formula —$SiR^{15}R^{16}$ wherein $R^6$ forms a cyclic silyl alkyl group together with the Si atom, preferably having 1 to 8 C atoms.

In one preferred embodiment $R^{15-17}$ are identical groups, for example identical, optionally substituted, alkyl groups, as in triisopropylsilyl. Very preferably $R^{15-17}$ are identical, optionally substituted $C_{1-10}$, more preferably $C_{1-4}$, most preferably $C_{1-3}$ alkyl groups. A preferred alkyl group in this case is isopropyl.

Preferred groups —$SiR^{15}R^{16}R^{17}$ include, without limitation, trimethylsilyl, triethylsilyl, tripropylsilyl, dimethylethylsilyl, diethylmethylsilyl, dimethylpropylsilyl, dimethylisopropylsilyl, dipropylmethylsilyl, diisopropylmethylsilyl, dipropylethylsilyl, diisopropylethylsilyl, diethylisopropylsilyl, triisopropylsilyl, trimethoxysilyl, triethoxysilyl, triphenylsilyl, diphenylisopropylsilyl, diisopropylphenylsilyl, diphenylethylsilyl, diethylphenylsilyl, diphenylmethylsilyl, triphenoxysilyl, dimethylmethoxysilyl, dimethylphenoxysilyl, methylmethoxyphenylsilyl, etc., wherein the alkyl, aryl or alkoxy group is optionally substituted.

Optionally, the OSC formulation comprises one or more organic binders, preferably polymeric binders, as described for example in US 2007/0102696 A1, to adjust the rheological properties, preferably in a proportion of binder to OSC compounds from 20:1 to 1:20, preferably 10:1 to 1:10, more preferably 5:1 to 1:5 by weight.

The total concentration of the OSC compounds in the formulation is preferably from 0.1 to 10%, more preferably from 0.5 to 5% by weight. The formulation may comprise one or more than one, preferably 1, 2, 3 or more than three OSC compounds.

The formulation according to the present invention may additionally comprise one or more further components like for example surface-active compounds, lubricating agents, wetting agents, dispersing agents, hydrophobing agents, adhesive agents, flow improvers, defoaming agents, deaerators, diluents which may be reactive or non-reactive, auxiliaries, colourants, dyes or pigments, sensitizers, stabilizers, nanoparticles or inhibitors. However, these further components should not be oxidising or otherwise capable of chemically reacting with the OSC or have an electrically doping effect on the OSC.

In the process of preparing an OE device, the OSC layer is deposited onto a substrate, followed by removal of the solvent together with any volatile conductive additives present. The OSC layer is preferably deposited from the inventive formulation by coating or printing techniques as described above and below.

The substrate can be any substrate suitable for the preparation of OE devices, or can also be the OE device, or a part thereof. Suitable and preferred substrates are e.g. flexible films of polyethylene terephthalate (PET), polyethylene naphthalate (PEN), polyimide, or planarised Si glass.

Removal of the solvent and any volatile additives is preferably achieved by evaporation, for example by exposing the deposited layer to high temperature and/or reduced pressure, preferably at 50 to 135° C.

The thickness of the OSC layer is preferably from 10 nm to 50 micron, more preferably from 20 nm to 5 micron, even more preferably from 50 nm to 1 micron, most preferably from 50 nm to 300 nm.

Further to the materials and methods as described above and below, the OE device and its components can be prepared from standard materials and standard methods, which are known to the person skilled in the art and described in the literature.

Especially preferred OE devices are OFETs. A preferred OFET according to the present invention comprises the following components:

optionally a substrate (1),
a gate electrode (2),
an insulator layer comprising a dielectric (3),
source and drain electrodes (4),
an OSC layer (5).

Figure 1:
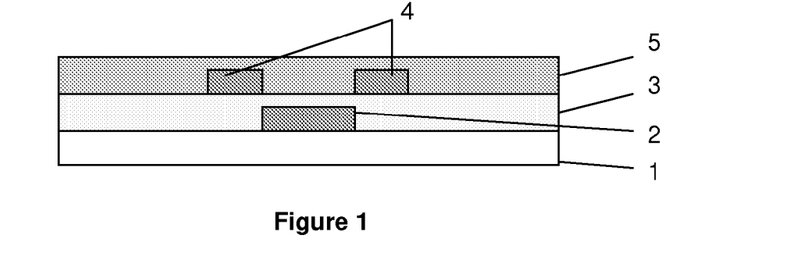
FIG. 1 exemplarily and schematically depicts the structure of a bottom gate OFET according to the present invention.

FIG. 1 exemplarily and schematically depicts a bottom gate (BG), bottom contact (BC) OFET device according to the present invention, comprising a substrate (1), a gate electrode (2), a dielectric layer (3), source and drain electrodes (4), and an OSC layer (5).

Such a device can be prepared by a process comprising the steps of applying a gate electrode (2) on a substrate (1), applying a dielectric layer (3) on top of the gate electrode (2) and the substrate (1), applying source and drain electrodes (4) on top of the dielectric layer (3), and applying an OSC layer (5) on top of the electrodes (4) and the dielectric layer (3).

Figure 2:
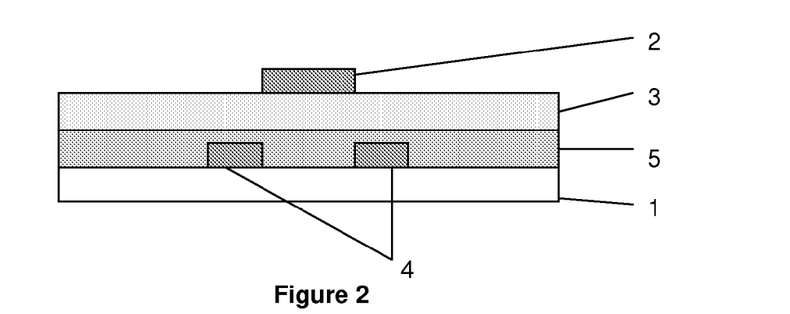
FIG. 2 exemplarily and schematically depicts the structure of a top gate OFET according to the present invention.

FIG. 2 exemplarily and schematically depicts a top gate (TG) OFET device according to the present invention, comprising a substrate (1), source and drain electrodes (4), an OSC layer (5), a dielectric layer (3), and a gate electrode (2).

Such a device can be prepared by a process comprising the steps of applying source and drain electrodes (4) on a substrate (1), applying an OSC layer (5) on top of the electrodes (4) and the substrate (1), applying a dielectric layer (3) on top of the OSC layer (5), and applying a gate electrode (2) on top of the dielectric layer (3).

In case of formulations for use in OPV cells, the formulation preferably comprises or contains, more preferably consists essentially of, very preferably exclusively of, a p type semiconductor and an n type semiconductor, or an acceptor and a donor material. A preferred material of this type is a blend or mixture of poly(3-substituted thiophene) or P3AT with a $C_{60}$ or $C_{70}$ fullerene or modified $C_{60}$ molecule like PCBM [(6,6)-phenyl C61-butyric acid methyl ester], as disclosed for example in WO 94/05045 A1, wherein preferably the ratio of P3AT to fullerene is from 2:1 to 1:2 by weight, more preferably from 1.2:1 to 1:1.2 by weight.

Figure 3:
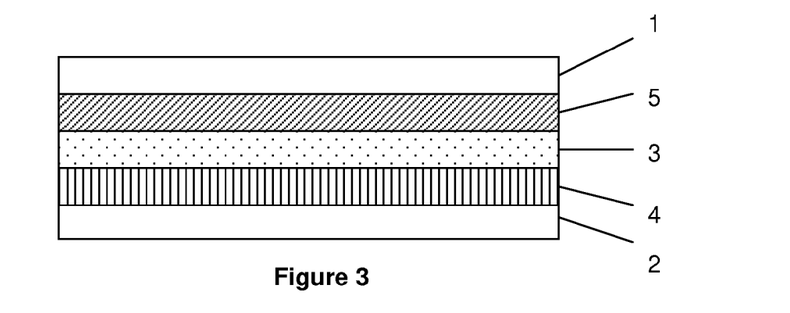
FIG. 3 exemplarily and schematically depicts the structure of an OPV device according to the present invention.
Figure 4:
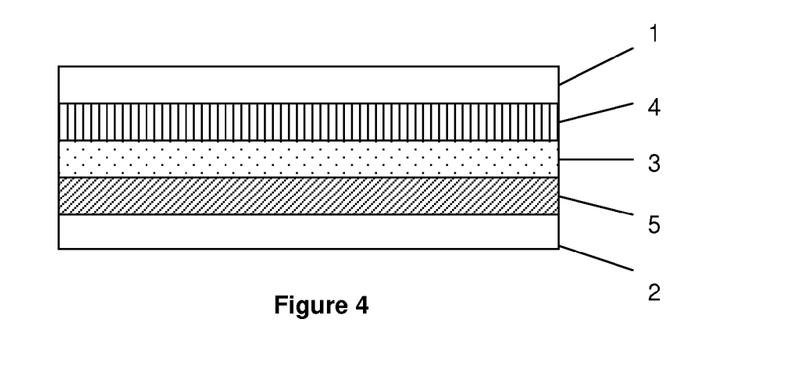
FIG. 4 exemplarily and schematically depicts the structure of an inverted OPV device according to the present invention.

FIG. 3 and FIG. 4 exemplarily and schematically depict typical and preferred OPV devices according to the present invention [see also Waldauf et al., Appl. Phys. Lett. 89, 233517 (2006)].

An OPV device as shown in FIG. 3 preferably comprises:

a low work function electrode (1) (for example a metal, such as aluminum), and a high work function electrode (2) (for example ITO), one of which is transparent, a layer (3) (also referred to as "active layer") comprising a hole transporting material and an electron transporting material, preferably selected from OSC materials, situated between the electrodes (1,2); the active layer can exist for example as a bilayer or two distinct layers or blend or mixture of p and n type semiconductor, an optional conducting polymer layer (4), for example comprising a blend of PEDOT:PSS (poly(3,4-ethylene-dioxythiophene):poly(styrenesulfonate)), situated between the active layer (3) and the high work function electrode (2), to modify the work function of the high work function electrode to provide an ohmic contact for holes, an optional coating (5) (for example of LiF) on the side of the low workfunction electrode (1) facing the active layer (3), to provide an ohmic contact for electrons.

An inverted OPV device as shown in FIG. 4 preferably comprises:

a low work function electrode (1) (for example a metal, such as gold), and a high work function electrode (2) (for example ITO), one of which is transparent, a layer (3) (also referred to as "active layer") comprising a hole transporting material and an electron transporting material, preferably selected from OSC materials, situated between the electrodes (1,2); the active layer can exist for example as a bilayer or two distinct layers or blend or mixture of p and n type semiconductor, an optional conducting polymer layer (4), for example comprising a blend of PEDOT:PSS, situated between the active layer (3) and the low work function electrode (1) to provide an ohmic contact for electrons, an optional coating (5) (for example of $TiO_x$) on the side of the high workfunction electrode (2) facing the active layer (3), to provide an ohmic contact for holes.

The hole transporting polymer is for example a polythiophene. The electron transporting material is for example an inorganic material such as zinc oxide or cadmium selenide, or an organic material such as a fullerene derivate (like for example PCBM) or a polymer (see for example Coakley, K. M. and McGehee, M. D. Chem. Mater. 2004, 16, 4533). If the bilayer is a blend an optional annealing step may be necessary to optimize device performance.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

It will be appreciated that many of the features described above, particularly of the preferred embodiments, are inventive in their own right and not just as part of an embodiment of the present invention. Independent protection may be sought for these features in addition to or alternative to any invention presently claimed.

The invention will now be described in more detail by reference to the following examples, which are illustrative only and do not limit the scope of the invention.

Example 1

Formulations of the organic semiconducting compound A are prepared in the solvents and solvent blends according to the present invention as shown in Table 1. The solvents and solvent blends in Table 1 have a calculated log P or $(\log P)_w$ of <1.5 and do all readily dissolve compound A in a concentration of >0.1 wt. %.

Compound A is a mixture of the following isomers

Compound A and its preparation are disclosed in S. Subramanian, J. Anthony et al., J. Am. Chem. Soc. 2008, 130, 2706-2707 (including Supporting Information).

TABLE 1

| No | Solvent or ink description [wt. %] | Viscosity[1] [cP] | log P[2] or (log P)$_w$[3] | B.p./ Max. b.p. in ° C. |
|---|---|---|---|---|
| 1 | α-terpineol | 36.5 (31° C.) | 2.6209 | 218 |
| 2 | 1% (A) in α-terpineol | 32.3 | 2.6209 | 218 |
| 3 | 1% (A) in 1-cyclohexyl-2-pyrrolidinone | 10.6 | 2.103 | 284 |
| 4 | 0.5% (A) in menthol | 76.4 | 3.233 | 212 |
| 5 | decahydro-2-naphthol | 630 | 2.699 | 109 at 14 Torr |
| 6 | 0.5% (A) in decahydro-2-naphthol | 514 | 2.699 | 109 at 14 Torr |
| 7 | 2% o-xylene 98% decahydro-2-naphthol | 396 | 2.708 | |
| 8 | 5% o-xylene 95% decahydro-2-naphthol | 231 | 2.721 | |
| 9 | 10% o-xylene 90% decahydro-2-naphthol | 124 | 2.743 | |
| 10 | 15% o-xylene 85% decahydro-2-naphthol | 82.7 | 2.765 | |
| 11 | 20% o-xylene 80% decahydro-2-naphthol | 52.7 | 2.787 | |
| 12 | 25% o-xylene 75% decahydro-2-naphthol | 34.9 | 2.809 | |
| 13 | 30% o-xylene 70% decahydro-2-naphthol | 30.3 | 2.831 | |
| 14 | 40% o-xylene 60% decahydro-2-naphthol | 20.8 | 2.875 | |
| 15 | o-xylene | 0.76 | 3.14 | 144 |
| 16 | N-cyclohexyl-pyrrolidinone | 10.4 | 2.103 | 284 |
| 17 | 3-methylcyclohexanol | 22.9 | 1.786 | 163 |
| 18 | carveol | | 2.749 | 226 |
| 19 | 1,2,3,4-tetrahydro-1-naphthol | 192 | 1.777 | 102 at 2 Torr |
| 20 | 2,5-dimethylcyclohexanol | 25 | 2.305 | 176 |
| 21 | 4-methylcyclohexanol | 37 | 1.786 | 170 |
| 22 | 25% tetralin, 75% 1,2,3,4-tetrahydro-1-naphthol | 25 | 2.261 | |
| 23 | 35% tetralin, 65% 1,2,3,4-tetrahydro-1-naphthol | 13.5 | 2.455 | |
| 24 | 40% tetralin, 60% 1,2,3,4-tetrahydro-1-naphthol | 11.0 | 2.552 | |
| 25 | 50% tetralin, 50% 1,2,3,4-tetrahydro-1-naphthol | 7.0 | 2.746 | |
| 26 | tetralin | 2.0 | 3.714 | 207 |
| 27 | 25% decalin, 75% decahydro-2-naphthol | 48 | 3.203 | |
| 28 | 50% decalin, 50% decahydro-2-naphthol | 10 | 3.742 | |
| 29 | decalin | 2.3 | 4.786 | 187 |

[1] at 25° C., unless stated otherwise
[2] for single sovents
[3] for solvent blends Comparative Example 1

Formulations of the organic semiconducting compound A in the solvents shown in Table 2 (the boiling points are all <400° C.) are prepared. The solubility of compound A in all these solvents is <0.1 wt. %. This shows that the solvents of Table 2 with a log P<1.5 and higher natural viscosities are poor solvents for OSC compounds, compared to those shown in Example 1.

| No | Solvent or ink description | Viscosity[1] [cP] | log P | Solubility of (A)[4] |
|---|---|---|---|---|
| C1 | ethylene glycol | 17.13 | −1.369 | No |
| C2 | 1,2,3-propanetriol | 934 | −1.538 | No |
| C3 | 2-pyrrolidinone | 13.4 | −0.16 | No |
| C4 | ethanolamine | 19.33 | −1.295 | No |
| C5 | triethanolamine | 607.7 | −1.226 | No |
| C6 | diethanolamine | 577 | −1.463 | No |
| C7 | propylene glycol | 43.22 | −1.037 | No |
| C8 | tripropylene glycol | 55.05 | −0.513 | No |
| C9 | N-(2-hydroxyethyl-2-pyrrolidinone) | 58.4 | −0.261 | No |
| C10 | cyclopentanol | 10.3 | 0.788 | No |
| C11 | cyclohexanol | 54.5 | 1.267 | No |
| C12 | benzyl alcohol | 5.5 | 1.104 | No |

[1] at 25° C.
[4] at 20° C.

Example 2

A bottom gate, bottom contact OFET device is prepared by flexographic printing of an ink according to the present invention.

The substrate PEN (Q 65FA, available from DuPont Teijin Films) is cut into small pieces, which are a little bit bigger than the gate mask. Then the substrate pieces are cleaned by sonicating them in methanol for 2 min, rinsed with methanol and dried with compressed air. A gate mask is placed to the cleaned substrate and an evaporator is used to coat aluminium with a thickness of 30 nm for use as a gate electrode.

An adhesion promoter Lisicon™ M 009 (commercially available from Merck KgaA, Darmstadt, Germany) is spin coated on the substrate and the Al gate electrode for 10 s with 1500 rpm, left for 20 s on a hot plate at 120° C. and then washed with propan-2-ol for 10 s with 1500 rpm.

Afterwards a solution of the dielectric material Lisicon™ D180 (commercially available from Merck KgaA, Darmstadt, Germany) is spin coated on top of the previous layer for 30 s at 1500 rpm, then the substrate is left for 1 min on a hot plate at 120° C. and then left for 30 s under a 254 nm UV lamp. Following this, it is left for 3 min on a hot plate at 120° C.

After that the substrate is covered with the reactive washing solution Lisicon™ M008 (commercially available from Merck KgaA, Darmstadt, Germany) for 1 min and washed with THF. The substrate is then covered for 1 min with the reactive washing solution Lisicon™ M001 (commercially available from Merck KgaA, Darmstadt, Germany) and washed with propan-2-ol. A source and drain mask are then placed on the dielectric coated substrate, and Au electrodes are evaporated onto the dielectric layer.

An OSC ink is formulated made up by dissolving 2% of compound (A) in 40% o-xylene and 60% decahydro-2-naphthol (see No. 14 in Table 1). This OSC ink is printed with a FLEXI PROOF 100 flexographic printer onto the dielectric layer and the Au electrodes, using an impression roller made up of a plurality of square blocks of print area measuring 5 cm×5 cm, 1 cm×1 cm, 5 mm×5 mm and 2 mm×2 mm. The conditions used are: anilox roller: 55 L/cm screen, volume: 18.09 cm³/m², printed speed: 30, anilox pressure: 50, impression roller pressure: 90.

Analysis of the device performance is then undertaken using an Agilent 4155 C semiconductor parameter analyzer, measuring the source and drain current and gate current as a function of the gate voltage (transistor characteristic). The charge carrier mobility is calculated by known methods, as disclosed for example in US 2007/0102696 A1.

Figure 5:
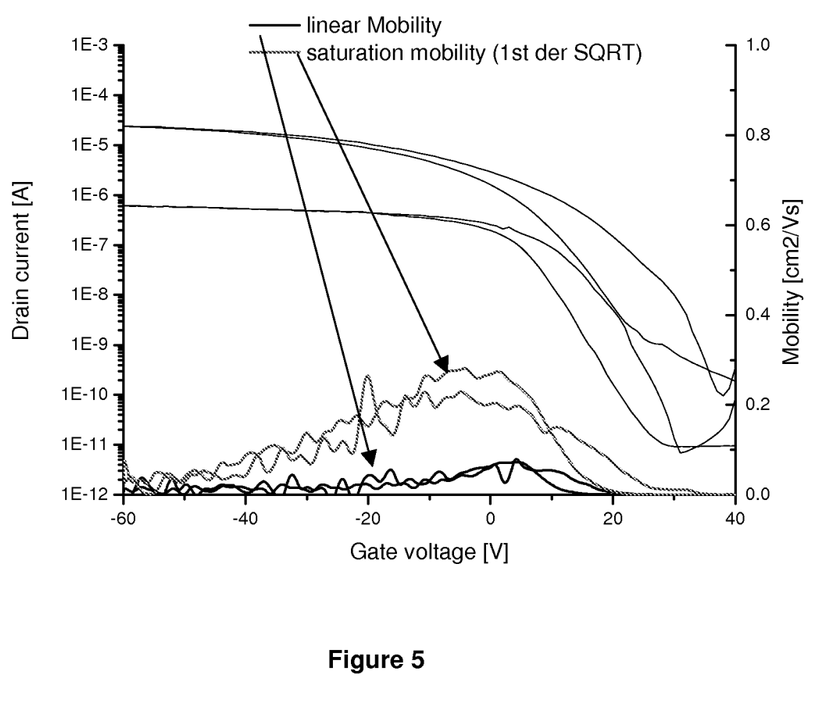
FIG. 5 shows the performance of an OFET device according to Example 2.

The transistor characteristic and the linear and saturation mobility of the device are depicted in FIG. 5. The device has a high mobility (linear 0.1 cm²/Vs, saturation 0.3 cm²/Vs) and a good on/off ratio ($10^5$).

The data show that the ink according to the present invention can be printed using flexographic printing techniques, and can also generate working transistor devices that demonstrate both high mobility and a good on/off ratio.

The invention claimed is:

1. A process of preparing an organic electronic device, comprising
   a) depositing a composition onto a substrate by flexographic printing or gravure printing,
   wherein the composition comprises an organic semiconducting compound and a solvent or a solvent blend comprising two or more solvents,
   wherein the partition ratio c log P of the solvent, or the weighted average of the partition ratio (c log P)$_w$ of the solvent blend, without any additives, is >1.5,
   wherein the viscosity of the solvent or the solvent blend, without any additives, is >10 cP at 25° C., and
   wherein the boiling point of the solvent or the solvent blend, without any additives, is <400° C. at 1 Torr, and
   b) removing the solvent or solvent blend.

2. A process according to claim 1, wherein the organic semiconducting compound is dissolved in the solvent or solvent blend at a concentration of 0.005 to 50% by weight.

3. A process according to claim 1, wherein the boiling point of the solvent or of the lowest boiling solvent of the solvent blend is >130° C. at atmospheric pressure.

4. A process according to claim 1, wherein the viscosity of the solvent or solvent blend is >50 cP at 25° C.

5. A process according to claim 1, wherein the log P of the solvent or the weighted average log P$_w$ of the solvent blend is >2.5.

6. A process according to claim 1, wherein the surface tension of the solvent or solvent blend, without any additives, is >15 dyne/cm and <80 dyne/cm.

7. A process according to claim 1, wherein the organic semiconducting compound is a polyacene or a poly(3-substituted thiophene).

8. A process according to claim 1, wherein the organic semiconducting compound is of formula I3 wherein
one of Y$^1$ and Y$^2$ denotes —CH= or =CH— and the other denotes —X—,
one of Y$^3$ and Y$^4$ denotes —CH= or =CH— and the other denotes —X—,
X is —O—, —S—, —Se— or —NR'''—,
R is, in case of multiple occurrence independently of one another, cyclic, straight-chain or branched alkyl or alkoxy having 1 to 20 C-atoms, or aryl having 2-30 C-atoms, all of which are optionally fluorinated or perfluorinated,
R' is H, F, Cl, Br, I, CN, straight-chain or branched alkyl or alkoxy having 1 to 20 C-atoms that is optionally fluorinated or perfluorinated, optionally fluorinated or perfluorinated aryl having 6 to 30 C-atoms, or CO$_2$R'', with R'' being H,
R''' is H or cyclic, straight-chain or branched alkyl with 1 to 10 C-atoms,
m is 0 or 1, and
o is 0 or 1,
with the proviso that, if X is S, R' is not hydrogen.

9. A process according to claim 1, wherein the composition consists of an organic semiconducting compound and a solvent or a solvent blend consisting of two or more solvents.

10. A process according to claim 1, wherein the composition does not contain a binder.

11. An organic electronic device, which is obtainable by a process according to claim 1.

12. An organic electronic device according to claim 11, which is selected from the group consisting of organic field effect transistors (OFET), integrated circuits (IC), thin film transistors (TFT), Radio Frequency Identification (RFID) tags, organic light emitting diodes (OLED), organic light emitting transistors (OLET), electroluminescent displays, organic photovoltaic (OPV) cells, organic solar cells (O-SC), flexible OPVs and O-SCs, organic laser diodes (O-laser), organic integrated circuits (O-IC), lighting devices, sensor devices, electrode materials, photoconductors, photodetectors, electrophotographic recording devices, capacitors, charge injection layers, Schottky diodes, planarising layers, antistatic films, conducting substrates, conducting patterns, photoconductors, electrophotographic devices, organic memory devices, biosensors and biochips.

13. A process according to claim 1, wherein the deposition of the composition onto the substrate is achieved by flexographic printing.

14. A process according to claim 1, wherein the deposition of the composition onto the substrate is achieved by gravure printing.

15. A process according to claim 8, wherein, in the compound of formula I3, m and o are 0, and/or X is S, and/or R' is F.

16. A process according to claim 8, wherein in the compound of formula I3 each R is an alkyl group.

17. A process according to claim 8, wherein the compound of formula I3 is and/or 18. A process according to claim 1, wherein the composition consists essentially of an organic semiconducting compound and a solvent or a solvent blend consisting essentially of two or more solvents.

* * * * *